(12) United States Patent
Chang et al.

(10) Patent No.: US 6,844,674 B2
(45) Date of Patent: Jan. 18, 2005

(54) ORGANIC LIGHT EMITTING DIDODE DISPLAY DEVICE HAVING LIGHT-ABSORBING LAYER

(75) Inventors: Mei-Ying Chang, Hsinchu (TW); Chi-Chih Liao, Hsinchu (TW); Jiun-Haw Lee, Hsinchu (TW)

(73) Assignee: RiTdisplay Corporation, Hsinchu (TW)

( * ) Notice: Subject to any disclaimer, the term of this patent is extended or adjusted under 35 U.S.C. 154(b) by 0 days.

(21) Appl. No.: 10/250,199

(22) Filed: Jun. 12, 2003

(65) Prior Publication Data

US 2003/0230974 A1 Dec. 18, 2003

(30) Foreign Application Priority Data

Jun. 12, 2002 (TW) ........................................ 91112772 A

(51) Int. Cl.[7] .............................................. H05B 33/00
(52) U.S. Cl. ...................................... 313/506; 313/504
(58) Field of Search ................................ 313/500–506; 445/24, 25, 50, 51; 428/690

(56) References Cited

U.S. PATENT DOCUMENTS 6,262,441 B1 * 7/2001 Bohler et al. ................ 257/103
6,589,673 B1 * 7/2003 Kido et al. .................. 428/690

* cited by examiner

*Primary Examiner*—Joseph Williams
(74) *Attorney, Agent, or Firm*—Jiang Chyun IP Office

(57) ABSTRACT

The present invention provides an organic light emitting diode display device, having a transparent substrate; a plurality of anodes on the transparent substrate; an organic functional layer on the transparent substrate, wherein the transparent substrate covers the anodes; a light-absorbing layer on the organic functional layer, wherein the light-absorbing layer is an organic material layer and the organic material layer is doped with at least a metal; and a plurality of cathodes on the light-absorbing layer. The light-absorbing layer of the present invention can effectively reduce the amount of the reflected light, thereby raising the contrast ratio and enhancing the recognition ability of the display device.

17 Claims, 6 Drawing Sheets

ORGANIC LIGHT EMITTING DIDODE DISPLAY DEVICE HAVING LIGHT-ABSORBING LAYER

CROSS REFERENCE TO RELATED APPLICATIONS

This application claims the priority benefit of Taiwan application Ser. no. 91112772, filed on Jun. 12, 2002.

BACKGROUND OF INVENTION

1. Field of the Invention

This invention generally relates to an organic light emitting diode display device, and more particularly to an organic light emitting diode display device having a light-absorbing layer.

2. Description of Related Art

Flat panels haven been widely used in communication industries as interfaces between the users and the machines such as portable communication products. Some major flat panel technologies are plasma display, liquid crystal display, electro-luminescent display, light emitting display and electro-chromic display. However, compared to those flat panel technologies, organic light emitting diode ("OLED") has advantages of self-emitting, less power consumption, low costs, low temperature operation, high response speed, and no viewing angle dependence. Hence, it is highly potential that OLED would be the flat panel display for next generation.

FIG. 1 is the cross-sectional view of a conventional organic light emitting diode display device. The conventional organic light emitting diode display device includes a transparent substrate 100, a plurality of strip anodes 102, an organic functional layer 104 and a plurality of strip cathodes 106. The transparent substrate 100 usually is a glass substrate; the transparent anode 102 material usually is Indium-Tin-Oxide ("ITO"); the organic functional layer 104 is a multi-layer organic thin film, wherein the organic functional layer 104 includes the hole injecting layer, the hole transmitting layer, organic light emitting diode, the electron transmitting layer, and the electron injecting layer; the metal cathode 106 material usually is Al, Ca, or Mg—Ag alloy.

The ratio of the maximum brightness and the minimum brightness is an important factor to decide the quality of a display device. This ration is so called "contrast ratio" ("CR"). The higher the ratio, the better the display device. The definition of the contrast ratio is as follows:

$$CR = \frac{L_{sub,on} + R_{amb}}{L_{sub,off} + R_{amb}} \quad (1)$$

Wherein $L_{sub, on}$ is the brightness when the pixels are turned on; $L_{sub, on}$ is the brightness when the pixels are turned off; $R_{amb}$ is the brightness of the reflected light when the incident light emits into the display device. Assume that the brightness when the pixels are turned on is 100 and the brightness when the pixels are turned off is 1. Hence, the relationship between CR and $R_{amb}$ can be shown according to (1).

FIG. 2 shows the relationship between the contrast ratio and the brightness of the reflected light for a conventional organic light emitting diode display device. As shown in FIG. 2, the higher the brightness of the reflected light, the less the contrast ratio. In other words, the recognition ability of a conventional organic light emitting diode display device becomes worse when the incident light is too strong. Hence, how to increase the recognition ability of the organic light emitting diode display device becomes an important concern.

LUXELL proposes an organic light emitting diode display device having an optical interference layer by adding a thin metal quasi-transmitting layer and a transparent material layer between the organic emitting layer and the metal cathode. Because of the effect of the destructive interference, the reflection rate can be reduced to below 1% in order to increase the contrast ration of the display device.

However, the organic functional layer of the organic light emitting diode display device is formed by evaporation. The transparent material layer (metal oxide) of the optical interference layer is formed by sputtering. The major drawbacks of the above structure are as follows: 1. It requires different equipment to form the organic functional layer and the transparent material layer. 2. The stress mismatch when using different equipment to form the organic functional layer and the transparent material layer would cause a higher err rate. 3. The organic functional layer would be damaged by the ion bombardment when forming the optical interference layer. 4. Sputtering process increases the costs for forming the optical interference layer because of higher costs of the sputtering equipment.

SUMMARY OF INVENTION

An object of the present invention is to provide an organic light emitting diode display device having a light-absorbing layer to effectively reduce the amount of the reflected light, thereby raising the contrast ratio and enhancing the recognition ability of the display device.

Another object of the present invention is to provide an organic light emitting diode display device having a light-absorbing layer, wherein the light-absorbing layer is formed by evaporation so that the process is compatible with that of forming the organic functional layer.

Still another object of the present invention is to provide an organic light emitting diode display device having a light-absorbing layer, wherein the light-absorbing layer is formed by evaporation so that it would not cause the damage of the organic functional layer due to ion bombardment.

In accordance with the above object and other advantages of the present invention, an organic light emitting diode display device having a light-absorbing layer is provided.

The present invention provides an organic light emitting diode display device, comprising: a transparent substrate; a plurality of anodes on the transparent substrate; an organic functional layer on the transparent substrate, wherein the transparent substrate covers the anodes; a light-absorbing layer on the organic functional layer, wherein the light-absorbing layer is an organic material layer and the organic material layer is doped with at least a metal; and a plurality of cathodes on the light-absorbing layer.

In the present invention, each of the anodes and the cathodes has a strip structure, and the extension of the anodes is perpendicular to the extension of the cathodes.

In the present invention, the material of the organic material layer includes Triazole, Oxadiazole (OXD), Triazine, and derivatives of Triazine; the material of the metal is selected from IA group metals, IIA group metals, and transition metals; the work function of the transition metal is less than or equal to 4.2 eV; the doping density of the metal is between 20% and 80%.

In the present invention, the organic functional layer includes a hole injecting layer on the anodes; a hole transmitting layer on the hole injecting layer; an organic light emitting layer on the hole transmitting layer; an electron transmitting layer on the organic light emitting layer; and an electron injecting layer on the electron transmitting layer.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

Figure 1:
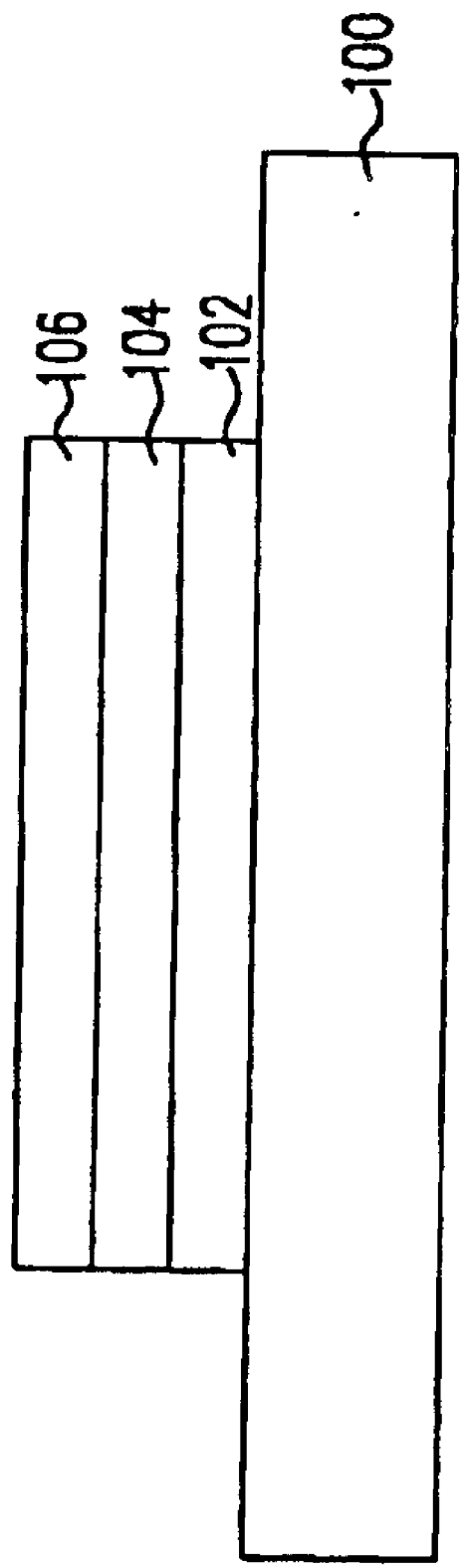
FIG. 1 is the cross-sectional view of a conventional organic light emitting diode display device.
Figure 2:
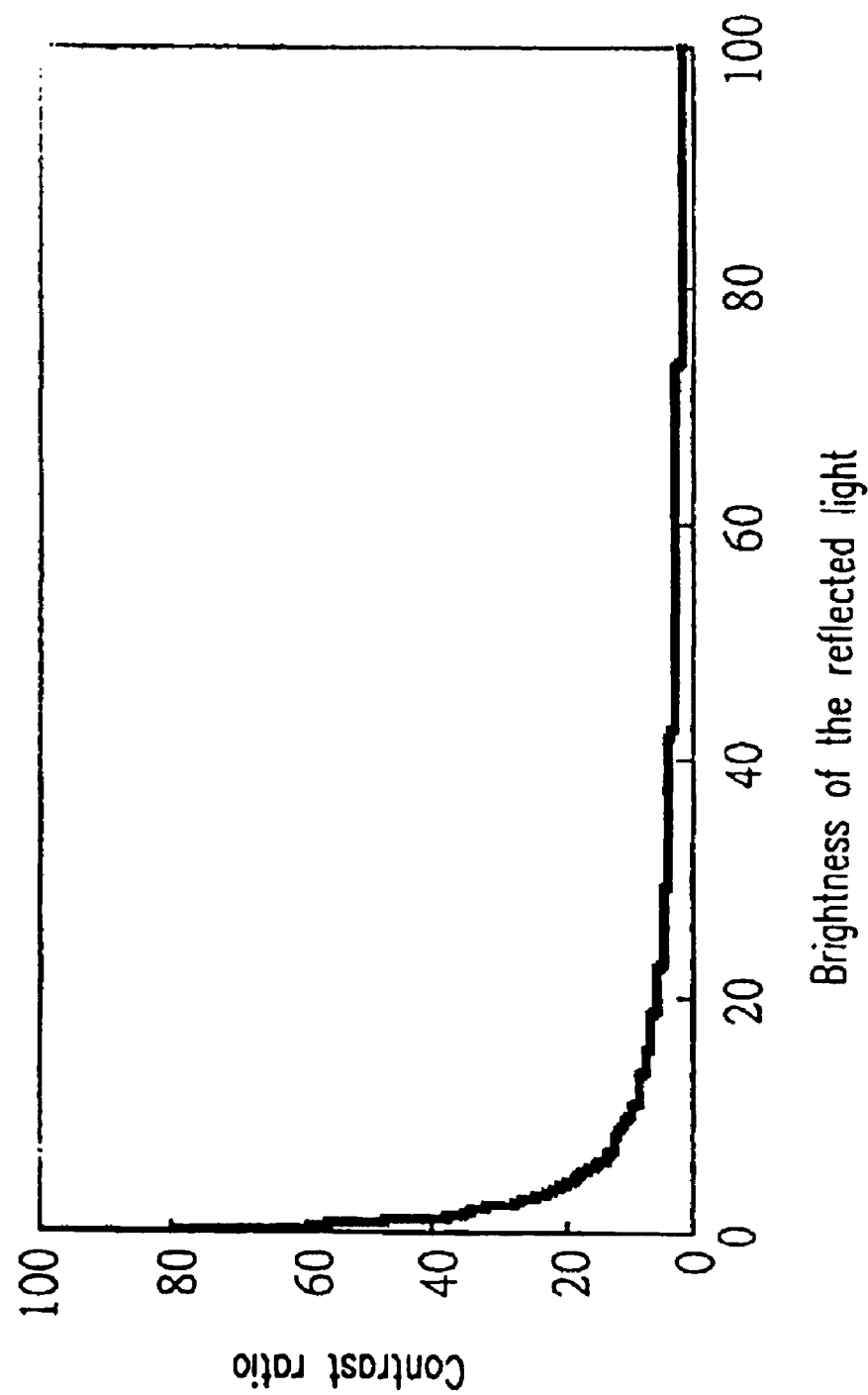
FIG. 2 shows the relationship between contrast ratio and the brightness of the reflected light for a conventional organic light emitting diode display device.
Figure 3:
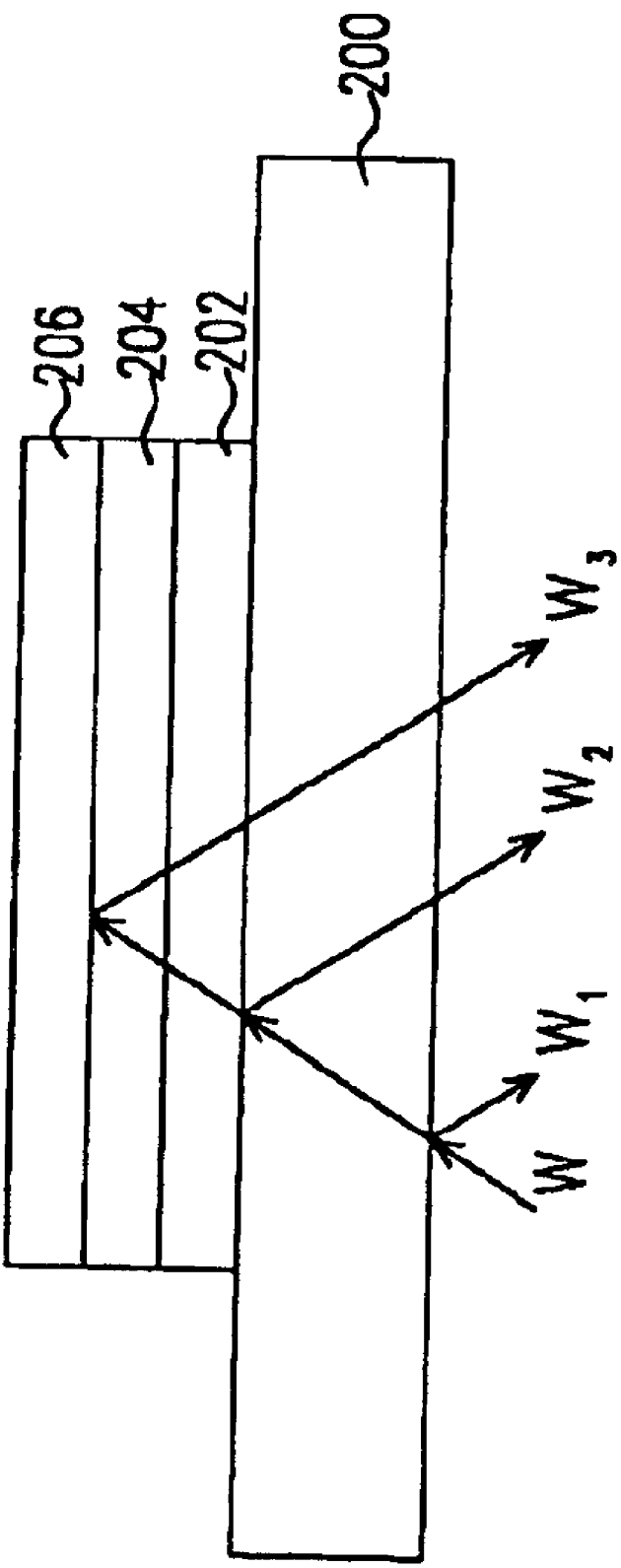
FIG. 3 shows the paths of incident light and the reflected light an organic light emitting diode display device.

FIG. 3 shows the paths of incident light and the reflected light an organic light emitting diode display device. The organic light emitting diode display device comprises a transparent substrate 200, a plurality of strip transparent anodes 202 on the transparent substrate 200, an organic functional layer 204 on the transparent substrate 200, and a plurality of strip metal cathodes 206. The reflection rate $n_1$ of the organic functional layer 204 is very close to the reflection rate $n_2$ of the transparent anodes 202. The reflection rate $n_1$ of the organic functional layer 204 is larger than the reflection rate $n_3$ of the transparent substrate 200, wherein $n_1$ is around 1.7, $n_2$ is between 1.8–2.0, $n_3$ is around 1.5, and $n_3$ is larger than the reflection rate of air (around 1).

The light of the organic light emitting diode display device is generated by the organic functional layer 204. Although the direction of the light is ransom, the light can transmit toward the transparent substrate 200 because the metal cathode 206 is deemed a reflecting layer.

The light toward the transparent substrate 200 will be affected by the light around the environment outside the display device, which makes the recognition ability of the display device worse. When the light around the environment enters into the display device, it will be reflected toward substrate 200 at the interfaces between air and the substrate 200, substrate 200 and the transparent anode 202, and the organic functional layer 204 and the metal cathode 206.

The reflected light $W_1$ at the interface between air and the substrate 200 is about 4% of the total reflected light; the reflected light $W_2$ at the interface between substrate 200 and the transparent anode 202 is about 0.8% of the total reflected light; the reflected light $W_3$ at the interface between the organic functional layer 204 and the metal cathode 206 is over 90% of the total reflected light. I.e., most of the reflected light is from interface between the organic functional layer 204 and the metal cathode 206.

Figure 4:
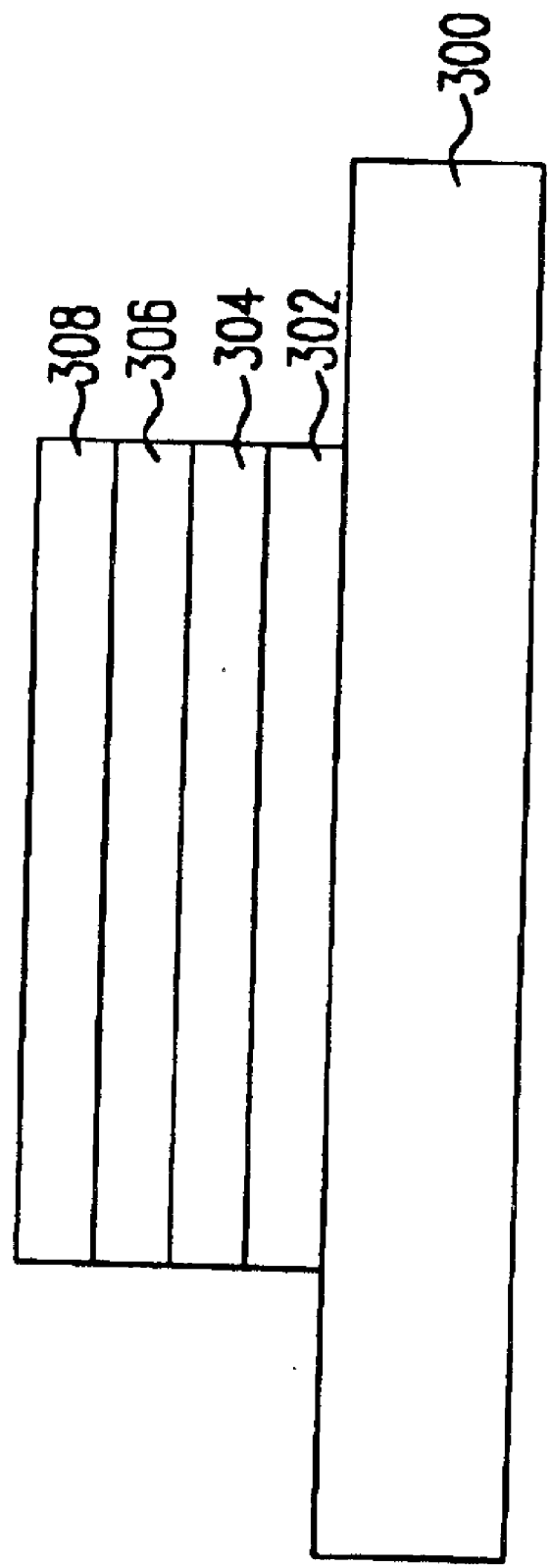
FIG. 4 is the cross-sectional view of a preferred embodiment of an organic light emitting diode display device in accordance with the present invention.

FIG. 4 is the cross-sectional view of a preferred embodiment of an organic light emitting diode display device in accordance with the present invention. The organic light emitting diode display device of the present invention comprises a transparent substrate 300, a plurality of strip transparent anodes 302 on the transparent substrate 300, an organic functional layer 304 on the transparent substrate 300, a light-absorbing layer 306 on the organic functional layer 304, and a plurality of strip metal cathodes on the light-absorbing layer 306. The transparent substrate 300 is usually a glass substrate. The material of the transparent anodes 302 usually is Indium-Tin-Oxide ("ITO") material. The organic functional layer 304 is a multi-layer organic thin film, wherein the organic functional layer 304 includes the hole injecting layer, the hole transmitting layer, organic light emitting diode, the electron transmitting layer, and the electron injecting layer. The metal cathode 308 material usually is Al, Ca, or Mg—Ag alloy.

The light-absorbing layer 306 is an metal doped organic material layer, wherein the material of said organic material layer includes Triazole, Oxadiazole (OXD), Triazine, and derivatives of Triazine, and the material of said metal is selected from IA group metals (e.g., Cs), IIA group metals, and transition metals having work function less than or equal to 4.2 eV. The doping density of the metal is between 20% and 80%. The light-absorbing layer 306 will cause optical destructive interference in order to reduce the reflection rate of the incident light around the environment and raise the contrast ratio of the display device.

Figure 5:
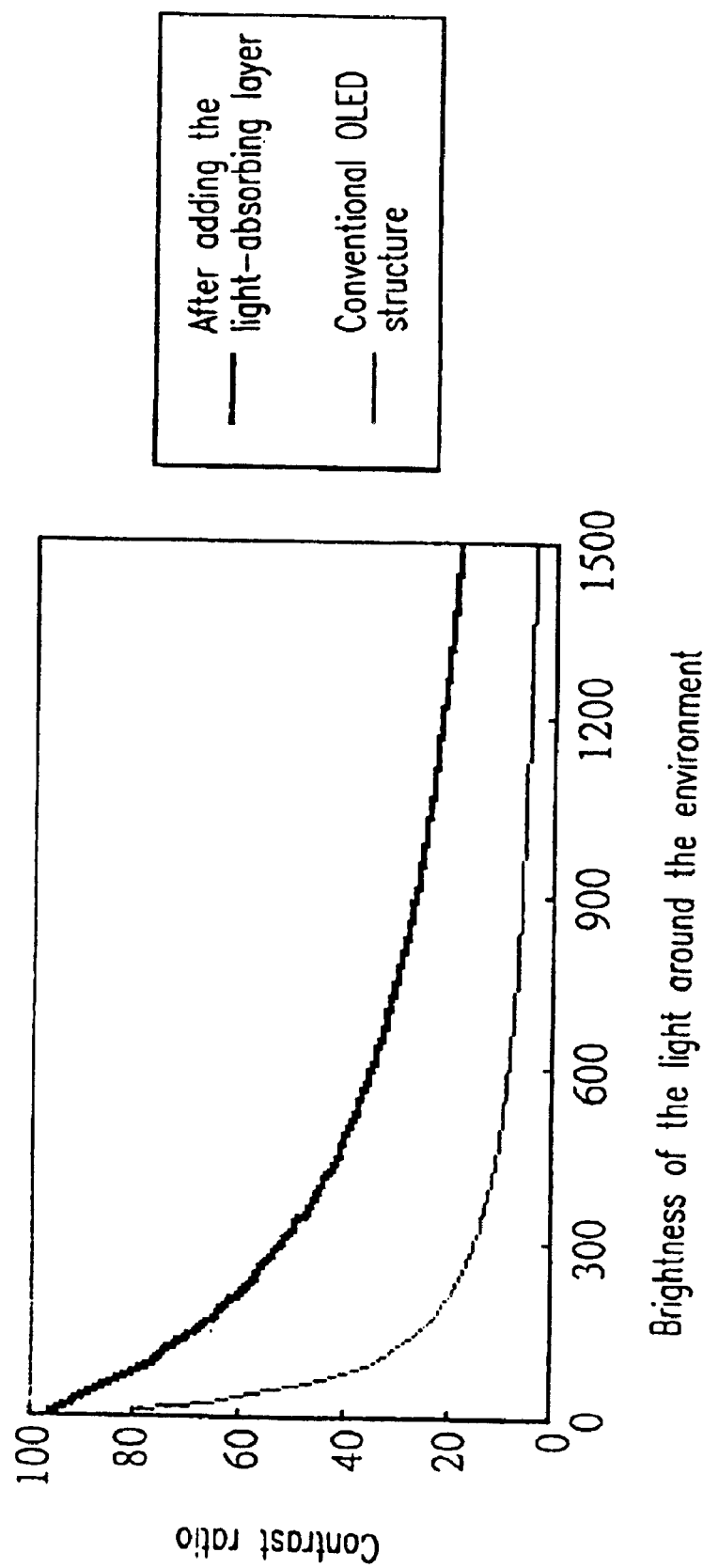
FIG. 5 shows the relationship between contrast ratio and the brightness of the reflected light for an organic light emitting diode display device.

FIG. 5 shows the relationship between contrast ratio and the brightness of the reflected light for an organic light emitting diode display device. As shown in FIG. 5, the organic light emitting diode display device of the present invention has a better contrast ratio than the conventional organic light emitting diode display device.

Figure 6:
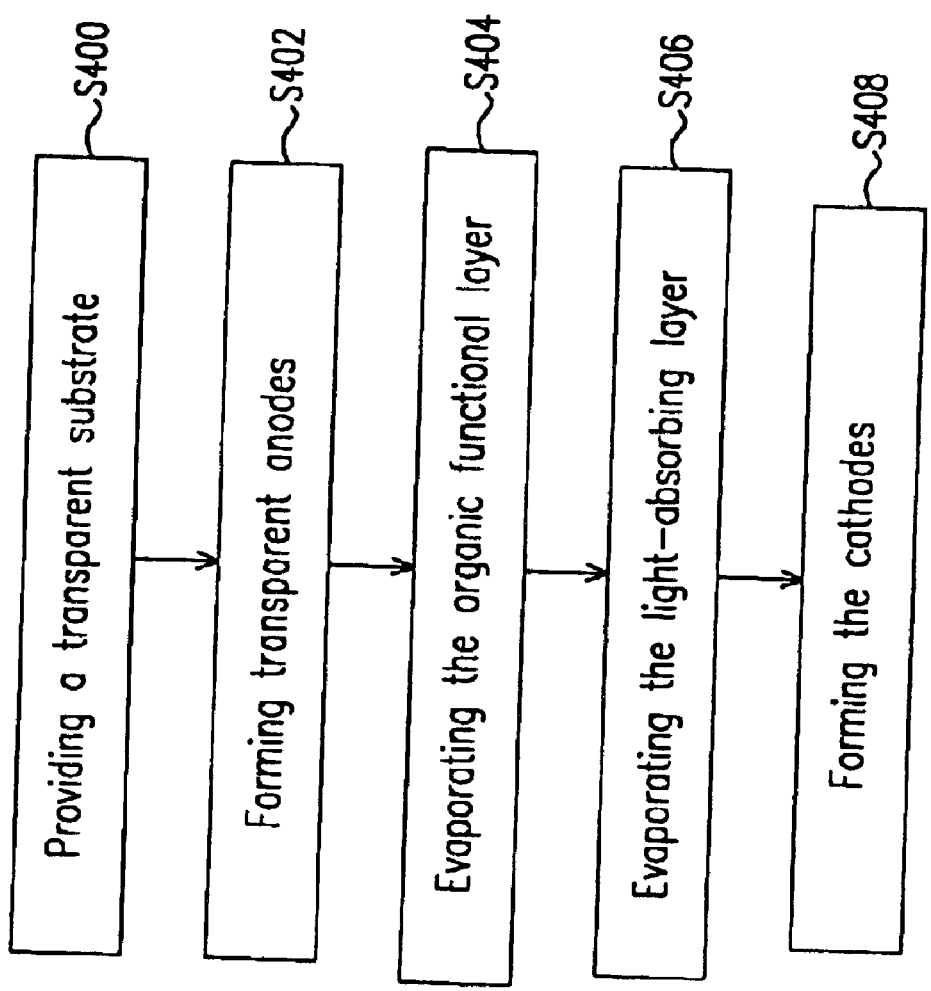
FIG. 6 is the flow chart of fabricating an organic light emitting diode display device in accordance with a preferred embodiment of the present invention.

FIG. 6 is the flow chart of fabricating an organic light emitting diode display device in accordance with a preferred embodiment of the present invention. First, a transparent substrate is provided (S400). Then the transparent anodes are formed (S402). The organic functional layer is then formed by evaporation (S404). The light-absorbing layer is then formed by evaporation (S406). Finally, the cathodes are formed (S408).

The present invention after evaporating the organic functional layer still uses the evaporation equipment to form the light-absorbing layer. The light-absorbing layer 306 can be formed by simultaneously evaporating the organic material and doping the metal, by controlling the evaporation rate to achieve the required density, by first evaporating the organic material and then doping the metal to control and then by drive-in diffusion of the metal.

Accordingly, the organic light emitting diode display device of the present invention has the following advantages: 1. The organic light emitting diode display device of the present invention can effectively reduce the amount of the reflected light, thereby raising the contrast ratio and enhancing the recognition ability of the display device. 2. The light-absorbing layer is formed by evaporation so that the process is compatible with that of forming the organic functional layer. 3. The light-absorbing layer is formed by evaporation so that it would not cause the damage of the organic functional layer due to ion bombardment.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. An organic light emitting diode display device, comprising:

a transparent substrate;

a plurality of anodes on said transparent substrate;

an organic functional layer on said transparent substrate, wherein said transparent substrate covers said anodes;

a light-absorbing layer on said organic functional layer, wherein said light-absorbing layer is an organic material layer and said organic material layer is doped with at least a metal; and a plurality of cathodes on said light-absorbing layer.

2. The organic light emitting diode display device of claim 1, wherein each of said anodes and said cathodes has a strip structure.

3. The organic light emitting diode display device of claim 2, wherein the extension of said anodes is perpendicular to the extension of said cathodes.

4. The organic light emitting diode display device of claim 1, wherein the material of said organic material layer includes Triazole, Oxadiazole (OXD), Triazine, and derivatives of Triazine.

5. The organic light emitting diode display device of claim 1, wherein the material of said metal is selected from IA group metals, IIA group metals, and transition metals.

6. The organic light emitting diode display device of claim 5, wherein the work function of said transition metal is less than 4.2 eV.

7. The organic light emitting diode display device of claim 5, wherein the work function of said transition metal is substantially equal to 4.2 eV.

8. The organic light emitting diode display device of claim 1, wherein the doping density of said metal is between 20% and 80%.

9. The organic light emitting diode display device of claim 1, wherein said organic functional layer includes a hole injecting layer on said anodes;

a hole transmitting layer on said hole injecting layer;

an organic light emitting layer on said hole transmitting layer;

an electron transmitting layer on said organic light emitting layer; and an electron injecting layer on said electron transmitting layer.

10. A light-absorbing layer suitable for setting between an organic functional layer and a plurality of cathodes in an organic light emitting diode display device, wherein said light-absorbing layer includes:

an organic material layer; and at least a metal, wherein said organic material layer is doped with said metal.

11. The light-absorbing layer of claim 10, wherein the material of said organic material layer includes Triazole, Oxadiazole (OXD), Triazine, and derivatives of Triazine.

12. The light-absorbing layer of claim 10, wherein the material of said metal is selected from IA group metals, IIA group metals, and transition metals having work function less than or equal to 4.2 eV.

13. The light-absorbing layer of claim 12, wherein the work function of said transition metal is less than 4.2 eV.

14. The light-absorbing layer of claim 12, wherein the work function of said transition metal is equal to 4.2 eV.

15. The light-absorbing layer of claim 10, wherein the doping density of said metal is between 20% and 80%.

16. The organic light emitting diode display device of claim 1, wherein the light-absorbing layer is used to increase a contrast ratio of the display device.

17. The light-absorbing layer of claim 10, wherein the light-absorbing layer is used to increase a contrast ratio.

* * * * *